(12) United States Patent
Karpman

(10) Patent No.: US 9,666,554 B2
(45) Date of Patent: May 30, 2017

(54) METHOD FOR INCORPORATING STRESS SENSITIVE CHIP SCALE COMPONENTS INTO RECONSTRUCTED WAFER BASED MODULES

(71) Applicant: The Charles Stark Draper Laboratory, Inc., Cambridge, MA (US)

(72) Inventor: Maurice Karpman, Cambridge, MA (US)

(73) Assignee: THE CHARLES STARK DRAPER LABORATORY, INC., Cambridge, MA (US)

(*) Notice: Subject to any disclaimer, the term of this patent is extended or adjusted under 35 U.S.C. 154(b) by 126 days.

(21) Appl. No.: 14/177,974

(22) Filed: Feb. 11, 2014

(65) Prior Publication Data

US 2014/0227834 A1    Aug. 14, 2014

Related U.S. Application Data

(60) Provisional application No. 61/763,360, filed on Feb. 11, 2013.

(51) Int. Cl.
| | | |
|---|---|---|
| *H01L 23/00* | (2006.01) | |
| *H01L 23/31* | (2006.01) | |
| *H01L 25/065* | (2006.01) | |
| *H01L 25/00* | (2006.01) | |
| *H01L 23/538* | (2006.01) | |

(52) U.S. Cl.
CPC .......... *H01L 24/80* (2013.01); *H01L 23/3121* (2013.01); *H01L 23/5389* (2013.01); *H01L 23/562* (2013.01); *H01L 25/0652* (2013.01); *H01L 25/50* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/2919* (2013.01); *H01L 2224/29101* (2013.01); *H01L 2224/32014* (2013.01); *H01L 2224/32225* (2013.01); *H01L 2224/4554* (2013.01); *H01L 2224/48091* (2013.01); *H01L 2224/48227* (2013.01); *H01L 2224/73265* (2013.01); *H01L 2224/92247* (2013.01); *H01L 2924/00014* (2013.01); *H01L 2924/12042* (2013.01); *H01L 2924/1461* (2013.01); *H01L 2924/15153* (2013.01); *H01L 2924/181* (2013.01)

(58) Field of Classification Search
CPC . H01L 24/80; H01L 23/3121; H01L 23/5389; H01L 23/562
USPC ............... 257/178, 678, 712, 723, 737, 738; 438/126
See application file for complete search history.

(56) References Cited

U.S. PATENT DOCUMENTS

2003/0080399 A1* 5/2003 Hedler .................. H01L 21/561
257/678

\* cited by examiner

*Primary Examiner* — Errol Fernandes
(74) *Attorney, Agent, or Firm* — Nutter McClennen & Fish LLP; John J. Penny, Jr.

(57) ABSTRACT

Techniques for constructing an electronic module are provided herein. For example, the techniques include orienting at least one die having a top side (e.g., a first side), a bottom side (e.g., a second side) and one or more side walls, on a substrate with the top side of the die proximate the substrate, coating the bottom side and each of the side walls of the die with a stress buffer material, forming a reconstructed wafer by encapsulating the coated die within a mold compound, and removing the substrate to expose the top side of the die.

7 Claims, 5 Drawing Sheets

METHOD FOR INCORPORATING STRESS SENSITIVE CHIP SCALE COMPONENTS INTO RECONSTRUCTED WAFER BASED MODULES

CROSS-REFERENCE TO RELATED APPLICATIONS

The present application is claiming priority of U.S. Provisional Patent Application Ser. No. 61/763,360, filed on Feb. 11, 2013, the content of which is herein incorporated by reference.

TECHNICAL FIELD

The present disclosure relates generally to semiconductor devices, and, more particularly, to construction and fabrication of high density electronic modules.

BACKGROUND

High density electronic modules have been designed and fabricated to satisfy the increasing demand for high levels of functionality in small packages. Products that may be made from the modules include memory, digital logic, processing devices, and analog RF circuits, sensors, etc. Typically, integration density of electronic modules is many times greater than what surface mount technology ("SMT") is capable of achieving and requires less set-up cost and development time. Moreover, some modules may be optimized for particular applications that demand multiple functions—for example, a pre-fabricated microelectronic die optimized for each desired function is selected, and the multiple dies are then interconnected and packaged together to form the electronic module.

Conventional fabrication of the electronic module can include microelectronic dies positioned on an adhesive-coated substrate. For example, the microelectronic dies can be positioned within (e.g., embedded in) a reconstructed wafer. However, such embedding, according to conventional fabrication techniques, subjects the semiconductor devices constructed within the microelectronic dies to severe environments during processing (e.g., up to ten, 200 deg. C. thermal shocks, 10 hours of 200 deg. C. thermal soak, exposure to chemicals, mechanical thinning, spin coating, etc.). Although some conventional semiconductor devices can tolerate these conditions, many additional devices would experience severe and uncontrolled performance degradation.

Accordingly, a need remains for fabrication techniques for incorporating stress sensitive components into reconstructed wafer based modules.

SUMMARY

In accordance with one or more embodiments described herein, this disclosure provides methods to shield or mitigate stress for stress sensitive components during manufacture of reconstructed wafers.

According to one or more embodiments of the disclosure, various stress mitigation is provided at various steps of reconstructed wafer manufacture, including but not limited to: pre-encapsulation (stress buffer coating); post encapsulation (die insertion); post thinning (die insertion); and post back side interconnect formation.

For example, with respect to pre-encapsulation, in some embodiments, a buffering material is placed between the sensitive device and the reconstructed wafer prior to molding. For example, a process or method for constructing an electric module can include steps for orienting at least one die on a substrate with its front or top side proximate the substrate. Notably, the die includes a top side, a bottom side and one or more side walls. The pre-encapsulation techniques also include steps for coating each non-proximate side of the die with a stress buffer material (e.g., the bottom side and each of the side walls of the die), forming a reconstructed wafer by encapsulating the coated die within a mold compound, and removing the substrate to expose the front side of the die.

With respect to post encapsulation or die insertion, in some embodiments, at least one die is placed on a substrate with a top side oriented proximate the substrate. As discussed above, each die typically includes a front side, a bottom side and one or more side walls. The process further includes steps for forming a reconstructed wafer by encapsulating the die within a mold compound. Once encapsulated, the process includes steps for removing the substrate to expose the top side of the die and a top side of the reconstructed wafer. In certain embodiments, the top side of the primary die and the top side of the reconstructed wafer are substantially co-planar. The post encapsulation or die insertion techniques also include steps for forming a cavity in the reconstructed wafer, the cavity having a bottom and defining one or more side walls in the reconstructed wafer extending from the bottom of the cavity and terminating at the top side of the reconstructed wafer. Further, these techniques include disposing a secondary die (the secondary die having a front side, a bottom side and one or more side walls) in the cavity such that the bottom side of the secondary die is proximate the bottom of the cavity. In some embodiments the secondary die can be attached to the bottom side of the cavity using stress buffer material.

In addition, for the post encapsulation techniques the secondary die can be disposed in the cavity so as to leave space between the secondary die side walls and the side walls of the cavity. In such cases, the space can be filled with fill material (e.g., stress buffer material, epoxy based materials, etc.) such that the fill material terminates at the substantially co-planar top side of the primary die and the top side of the reconstructed wafer.

In certain embodiments for the post-encapsulation techniques, a dielectric film can be disposed on the top side of the reconstructed wafer and on the top side of the secondary die or, alternatively, one or more metal layers can be disposed on one or more of the top side of the secondary die and the top side of the primary die to form a top side interconnect.

In further post encapsulation embodiments, a method for constructing an electronic module can include steps for orienting at least one primary die having a top side, a bottom side and one or more side walls on a substrate with the top side proximate the substrate and forming a reconstructed wafer by encapsulating the primary die within a mold compound. Notably, the reconstructed wafer is defined by one or more side walls separating a top side and a bottom side. The post encapsulation techniques further include steps for removing the substrate from the primary die and the reconstructed wafer exposing the top side of the reconstructed wafer and the top side of the primary die, disposing one or more metal layers on the top side of the reconstructed wafer and the top side of the primary die to form a front side interconnect layer, and forming a cavity in the reconstructed wafer (e.g., typically post thinning). The cavity includes a bottom and defining one or more side walls in the reconstructed wafer extending from the bottom of the cavity that terminate at the bottom side of the reconstructed wafer. A secondary die is disposed in the cavity (e.g., such that that the bottom side of the secondary die is proximate the bottom of the cavity, etc.).

In certain embodiments, the secondary die is disposed in the cavity so as to leave a space between the one or more side walls of the secondary die and the one or more side walls defined by the cavity in the reconstructed wafer. Fill material (e.g., stress buffer material, epoxy, etc.) can be filled in the space. The fill material typically terminates at the bottom side of the reconstructed wafer.

In certain other embodiments, the cavity is filled, in part, with stress buffer material prior to disposing the secondary die in the cavity. In this fashion, the secondary die, when disposed in the cavity, is separated from the reconstructed wafer (e.g., the cavity bottom) by the stress buffer material.

In additional embodiments, a dielectric film is formed on the bottom side of the reconstructed wafer and on the front side of the secondary die. Alternatively, one or more metal layers are disposed or deposited on the bottom side of the reconstructed wafer and the top side of the secondary die to form a back side interconnect layer.

In other embodiments, a cavity can be formed in during one or more stages of manufacture of the reconstructed wafer so as to allow the device to be incorporated while avoiding some or all of the process based severe environments. For example, the bottom side of the reconstructed wafer is thinned and a back side interconnect is formed (e.g., disposing metal layers on the bottom side of the reconstructed wafer and a bottom side of each primary die) prior to forming the cavity. In such embodiments, the cavity is formed through at least a portion of the back side interconnect layer as well as the reconstructed wafer. The secondary die can then be connected, electrically, to the backside interconnect (e.g., wire bonds such as low profile wire bonding, insulated wire, etc.).

It should be appreciated that the present technology can be implemented and utilized in numerous ways, including without limitation as a process, an apparatus, a system, a device, a method for applications now known and later developed. These and other unique features of the technology disclosed herein will become more readily apparent from the following description and the accompanying drawings.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXEMPLARY EMBODIMENTS

Figure 1:
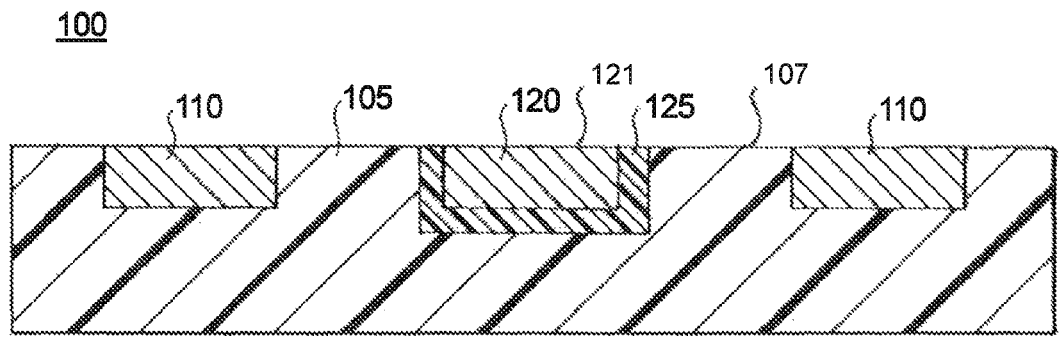
FIG. 1 illustrates a cross-sectional view of a reconstructed wafer according to one or more embodiments disclosed herein.

Reconstructed wafers are typically formed by fabricating a composite wafer with embedded chip scale component using a molding process. However, as discussed above, the molding process can expose various devices to harsh environmental conditions, which conditions form barriers to embedding stress-sensitive chip scale devices or components.

Particularly, the molding process can include one or more example steps, which steps can cause damage to embedded devices. In some instances, the mold compound can shrink around various disposed devices thereby creating significant in-plane stresses, which can ultimately damage the devices. A bowing process can also generate significant stress on embedded components. A thinning process, in which the molded wafer is shaved or "thinned" by various mechanical means (e.g., shaving, routing, grinding, etc.), also causes significant mechanical stress on the wafer as well as components disposed therein. In some instances, the wafer can be subjected to spinning at a high rotational velocity (e.g., spin coating, SRD, etc.), which can impact devices having movable elements (e.g., micro-relays, oscillators, resonators, devices with air bridges, etc.). Further, some processes can involve thermal shock or long term exposure to temperatures exceeding maximum temperature ratings for certain stress-sensitive components. Particularly, some processes such as a dielectric curing can involve abrupt transition from ambient to 200 deg. C., one hour at 200 deg. C., and an abrupt transition to ambient. This cycle can be repeated, in some instances, from 5 to greater than 10 times depending on the device.

As discussed herein, this disclosure provides various stress mitigation at various steps of reconstructed wafer manufacture, including but not limited to: pre-encapsulation (e.g., stress buffer coating); post encapsulation (e.g., die insertion); post thinning (e.g., die insertion); and post back side interconnect formation. Generally, it is advantageous to apply the stress mitigation as early in the process as possible, as there is less value added to the assembly in the case of induced yield loss. Further, as discussed herein, the words top and front are used synonymously as well as bottom and back, as is appreciated by those skilled in the art.

Modules fabricated with a subset of steps and variations thereof are possible as is understood by those skilled in the art (e.g., a module may use means other than solder balls for the next level interconnect, modules may be stacked or have bare dies or SMT components attached to one or both surfaces, etc.). Generally, one or more dies are placed onto a substrate with a front side of each die facing the substrate. For example, additional detail regarding substrates, die placement, and forming reconstructed wafers can be found in Ser. No. 14/177,595, filed on Feb. 11, 2014, the content of which is herein incorporated by reference. Typically, a front side of each die typically includes pads for electrical interconnection. For integrated circuits, the front side is typically a surface that contains one or more active device components. Additionally, the substrate is coated with an adhesive to keep the dies in place and to protect the surface of the dies. Notably, some dies can include through-substrate VIAs (TSV), which includes conductive paths that extend from the front side of the die to the back side. These conductive paths typically include solid metal posts or insulating posts with a metal coating.

After the die is placed on the substrate, the die can be encapsulated (e.g., molded). A disc of encapsulant (e.g., mold compound, epoxy, plastic, etc.) is typically formed against the substrate such that each die is embedded in the encapsulant. The disc of encapsulant, as discussed herein, is referred to as a wafer and/or a reconstructed wafer. Once encapsulated, the substrate is removed to expose the front side of respective die or dies.

In some embodiments, a dielectric layer can be placed on top of the front side of wafer (e.g., the side of the wafer that contains the exposed dies front sides is the front side of the wafer). The front side of the wafer can be coated with a layer of dielectric material that is typically a liquid polymer applied by spin-coating or spray coating. Alternatively, the dielectric layer can be a polymer film that is laminated. Openings are made in the dielectric layer to expose the electrical interconnect pads on the dies and the openings can be photo-defined, ablated, e.g., with a laser, etc. After the dielectric layer is formed, a layer of metal can be deposited on top such that the metal can extend through openings in the dielectric layer and connect to the electrical interconnect pads on the dies. Subsequently, the metal layer is patterned to form an interconnect layer, which can be formed using, for example, etching processes, additive processes, etc. Dielectric coating, metal deposition, and metal patterning can be repeated until the entire front side interconnect structure is complete. Typically, this is a total of 6 metal layers but can vary from 1 to many.

Once the front side interconnect structure is complete, the wafer can be turned over so that the 'back side' is now on top. The 'front side' or 'top side' of the reconstructed wafer can be attached to a handle wafer to provide mechanical support during subsequent processing and to protect the front side interconnect. The attachment is typically done with a temporary bonding agent. Once flipped over, the back side of the reconstructed wafer is mechanically thinned to reduce the thickness of the finished module and to expose the electrical contacts on the TSV dies, allowing electrical connection to be made between the front side interconnect and the back side interconnect. Notably, in some processes, the wafer need not be thinned, but the process can be formed on the back side of the reconstructed wafer directly.

As discussed above with respect to the front side dielectric layer, the back side of the wafer can also be coated with a dielectric layer, followed by a metal layer, and patterning to form a back side interconnect. Once the back side interconnect is formed, the handle wafer is removed (if used). Notably, such back side interconnect, depending on the desired application may be an optional step in wafer processing. Further, some modules can include solder balls attached to one or both of the front side or back side surfaces. The module, once completed, can be further attached to a next level of interconnect (e.g., a Printed Circuit Board (PCB)).

Referring now to FIG. 1, a cross-sectional view of a reconstructed wafer according to one or more embodiments disclosed herein according to pre-encapsulation process 100. Notably, the reconstructed wafer includes a pre-encapsulated stress sensitive component. According to the embodiment shown in FIG. 1, a portion of the device (which will be encapsulated during the molding process) is substantially coated with a compliant material such as a silicone polymer to absorb mechanical stresses transmitted through the mold compound while maintaining adhesion to the mold compound and compatibility with the thermal exposures of the device FIG. 1 provides a reconstructed wafer 105, die or dies 110, and a stress sensitive device 120. Notably, stress sensitive device 120 can include any type of stress sensitive device (e.g., a die). Due to stress sensitivity, device 120 is encapsulated on all sides by stress buffer 125 (except a top side 121, which remains proximate to a substrate (not shown) during formation of wafer 105). In operation, device 120 is encapsulated by stress buffer 125 prior to being disposed in wafer 105. Stress buffer 125 mitigates and absorbs mechanical stresses (e.g., shrinking of wafer 105 during processing) while maintaining adhesion to wafer 105. Preferably, stress buffer 125 can include a compliant material such as a silicone polymer. Preferably, stress buffer 125 is a material characterized by a low durometer, highly adhesive properties, and can tolerate and buffer exposure to extreme temperatures as well as chemical processes.

Pre-encapsulating stress sensitive components can be used for devices whose performance is adversely impacted by mechanical or thermo-mechanical stress during manufacturing of wafer 105. Such components can include, for example, Radio Frequency (RF) components, analog components, micro-electro-mechanical systems (MEMS) devices (e.g., micro relays, etc.), etc.

Operatively, stress sensitive device 120 is initially coated with and/or surrounded by a stress buffer 125, which material covers the entire device 120, except the front or top side 121. Device 120 is placed with the top side 121 proximate the substrate (not shown). Additionally, one or more other dies 110 can also be placed on the substrate. A disc of encapsulant and/or reconstructed wafer 105 (e.g., mold compound, epoxy, plastic, etc.) is formed against the substrate such that each die 110 and device 120 are embedded (e.g., surrounded) in the encapsulant. Stress buffer 125, which surrounds device 120 prevents the mold compound from contacting the device 120 and absorbs the mechanical stress induced by the shrinkage of the mold compound during the encapsulation process, thus protecting the device 120. Post encapsulation, the substrate is removed from the top side 121 of device 120 as well as respective top sides of dies 110 and a top side 107 of reconstructed wafer 105.

Figure 2A:
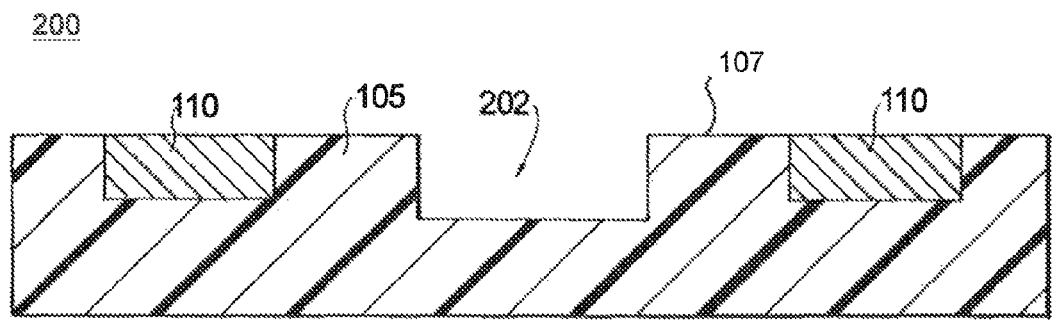
FIGS. 2A-2D illustrate cross-sectional views of the reconstructed wafer shown in FIG. 1 for disposing a stress sensitive device post molding of the wafer.

FIGS. 2A-2D illustrate cross-sectional views of the reconstructed wafer shown in FIG. 1 for disposing a stress sensitive device post molding of the wafer according to process 200. For example, FIG. 2A illustrates a cross sectional view of wafer 105 after the molding is complete. As shown, wafer 105 includes die or dies 110 as well as a cavity 202. Cavity 202 can be formed, for example, using a place holder die (e.g., a spacer) during the molding process, removing parts of wafer 105 post molding (e.g., milling via mechanical, laser, etc.), chemical etching, or any other forming process as understood by those skilled in the art. Further, although cavity 202 is shown at a certain depth, such view if for purposes of illustration and not limitation. That is, in some embodiments, cavity 202 may extend through the thickness of wafer 105.

Figure 2B:
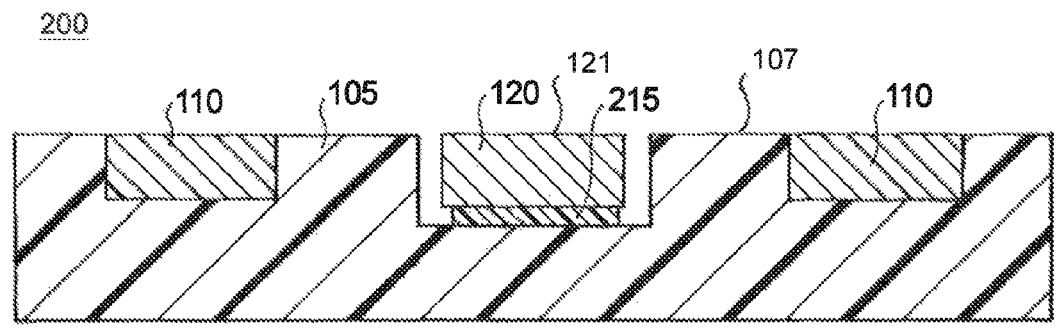

Referring to FIG. 2B, stress sensitive device 120 can be placed in cavity 202. As shown, device 120 can, for example, be placed in cavity 202 and attached to wafer 105 via a "die attach" 215. Die attach 215 can include an organic adhesive, a generic bonding adhesive, a solderable metal, etc.

Figure 2C:
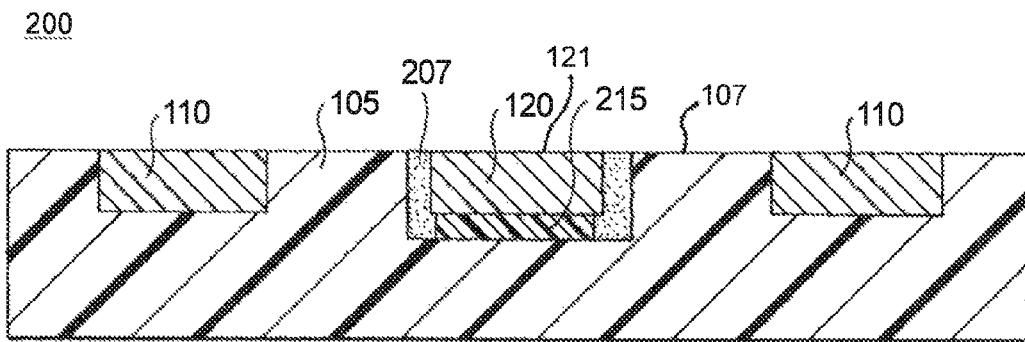

Referring to FIG. 2C, a fill material 207 can be used to fill in between the sides of device 120 and wafer 105 to encapsulate device 120. Fill material 207 can include organic material such as an expoxy filled with silica parts to provide a planar surface for a subsequent application of a dielectric layer (discussed below). Operatively, fill material 207 can be formed in a variety of processes. For example, fill material can be formed from pouring a liquid encapsulate between the gaps between device 120 and wafer 105, depositing and melting a thermoplastic solid, spin coating a dielectric (e.g., under a vacuum, multiple coats, etc.), and various other methods known by those skilled in the art. In alternative embodiments, fill material can include various gasses or even may be foregone in favor of a vacuum enviornment.

Notably, device 120 can include a protective film (not shown) over its face to protect against contamination during encapsulation. Such film can be removed after placement of device 120 and/or after encapsulation. Alternatively, the film can be left in place as a permanent part of device 120 (accessible via laser ablation of VIA(s), etc.). In some embodiments, device 120 can include conductive pillars formed on its bond pads that can extend above any encapsulate that might encroach its face. Such conductive pillars can be formed, for example, by plating metal, depositing and reflowing metal, wire bonding, depositing a metal particle filled dielectric, etc.

Figure 2D:
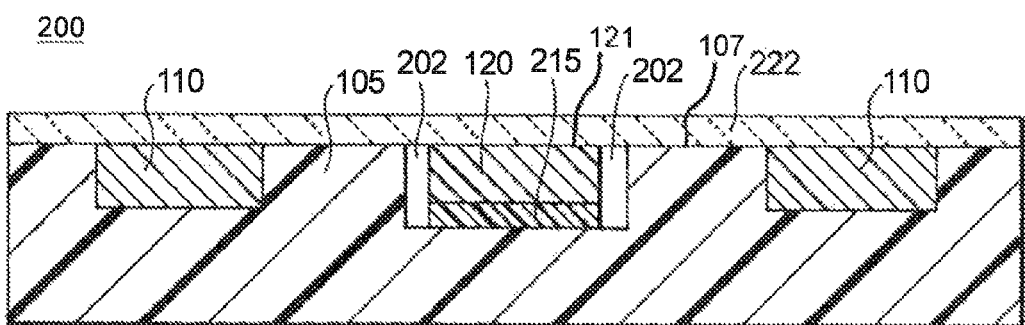

FIG. 2D shows a dielectric film 222 that secures device 120 to wafer 105. Here, fill material 207 is removed (if even used) leaving a portion of cavity 202 between device 120 and wafer 105. Dielectric film 222 is placed over the top side 107 of wafer 105 and over the top side 121 of device 120. Dielectric film 222 can include a non-photo-definable (e.g., Kapton) material and need subsequent laser ablation of VIA(s), or a photo-definable material.

Devices suitable for depositing in cavity 202 shown in FIGS. 2A-2D include devices that can withstand spin coating, thinning and thermal processing, but devices that may otherwise be damaged by molding induced mechanical stress. That is, by depositing the device after molding, the device will not be exposed to the mechanical stresses associated with shrinkage of the wafer. Such devices can include, for example, analog integrated circuits (ICs), RF ICs, MEMS devices (e.g., precision devices, inertial sensors, etc.)

Figure 3A:
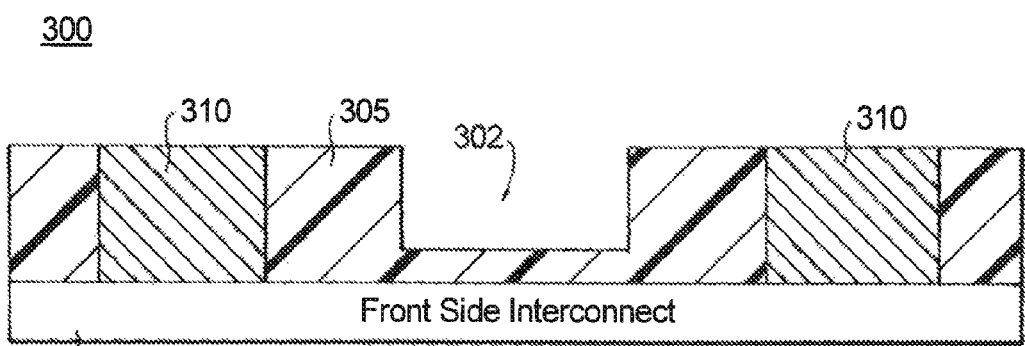
FIGS. 3A-3D illustrate a cross-sectional view of a reconstructed wafer post wafer molding, post front side processing (e.g., front side interconnect formation), and post back side thinning.

FIGS. 3A-3D illustrate a cross-sectional view of a reconstructed wafer 305 incorporating one or more die post wafer molding, post front side processing (e.g., front side interconnect formation), and post back side thinning according to process 300. In particular, FIG. 3A provides a wafer 305 including die or dies 310 disposed therein, a front side interconnect 317, and a cavity 302. As discussed above with respect to cavity 202, cavity 302 can be formed using a place holder die (e.g., a spacer) during the molding process, removing parts of wafer 105 post molding (e.g., milling via mechanical, laser, etc.), chemical etching, or any other forming process as understood by those skilled in the art. However, here cavity 302 is formed on a back side of wafer 305. Notably, reconstructed wafer 300 is shown subsequent to a thinning process, which removed excess material (e.g., wafer 105, excess die material, etc.) such that a back side of each die 310 is exposed.

Figure 3B:
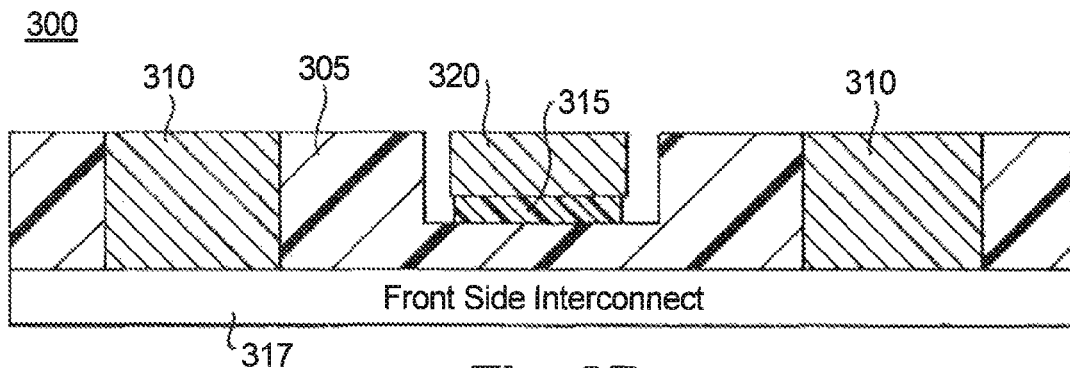

FIG. 3B shows stress sensitive device 320 disposed in cavity 302. As shown, device 320 can be disposed in cavity 302 and attached to wafer 105 via a "die attach" 315 (e.g., similar to die attach 215 in FIG. 2 above). As discussed above, die attach 315, like die attach 215 can include a bonding adhesive, a solderable metal, etc.

Figure 3C:
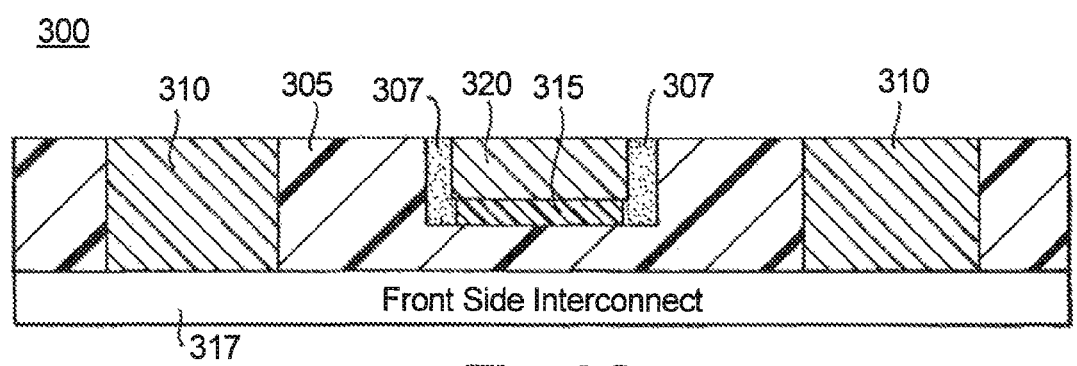

FIG. 3C, similar to FIG. 2C, shows a fill material 307 between device 320 and wafer 305. As discussed above with respect to fill material 207, fill material 307 can be used to fill in between the sides of device 320 and wafer 305 to encapsulate device 320. Fill material 307, like fill material 207, can include an epoxy filled with silica particles, and operatively, can be formed in a variety of processes as discussed above. Additionally, device 320, like device 120, can include a protective film (not shown) over its face to protect against contamination during encapsulation. Such film can be removed after placement of device 320 and/or after encapsulation. Alternatively, the film can be left in place as a permanent part of device 320 (accessible via laser ablation of VIA(s), etc.). In some embodiments, device 320 can include conductive pillars formed on its bond pads that can extend above any encapsulate that might encroach its face. Such conductive pillars can be formed, for example, by plating metal, depositing and reflowing metal, wire bonding, depositing a metal particle filled dielectric, etc.

Figure 3D:
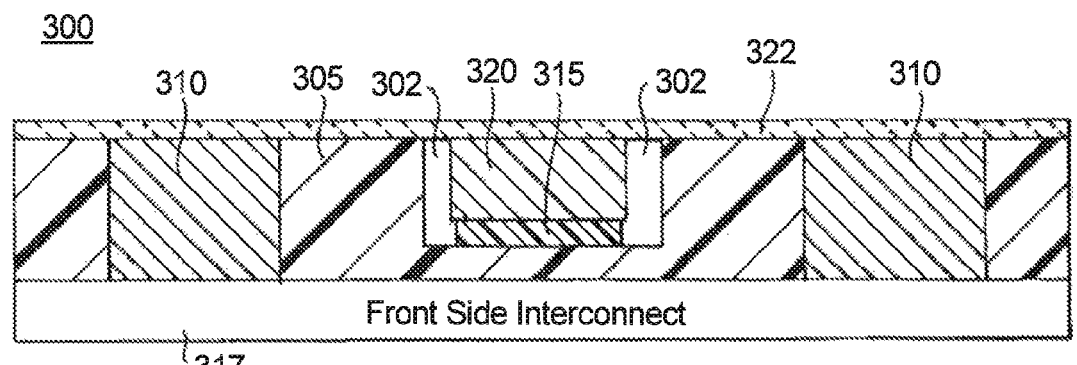

FIG. 3D shows a dielectric film that secure device 320 to wafer 305. As discussed above with respect to FIG. 2D, portions of cavity 302 remain between device 320 and wafer 305; however, a dielectric film 322 can be placed over the surface of wafer 305 and attach to the face of device 320. Dielectric film 322 can include the same type of dielectric film described above with respect to dielectric film 220.

Devices suitable for depositing in cavity 302 shown in FIGS. 3A-3D can include devices that can withstand spin coating, but not thinning. Examples of such devices can include devices made of brittle materials such as GaAs, devices with deep structures such as iPDIA capacitors, MEMS such as high precision timing devices, high sensitivity inertial sensors, MEMS devices with glass frit seals that could crack during the thinning process. The latter includes many types of MEMS.

FIGS. 4A-4F illustrate a cross-sectional view of a reconstructed wafer 405 that incorporates one or more die according to process 400 and after wafer molding, front side interconnect formation, back side thinning, and back side interconnect formation.

Figure 4A:
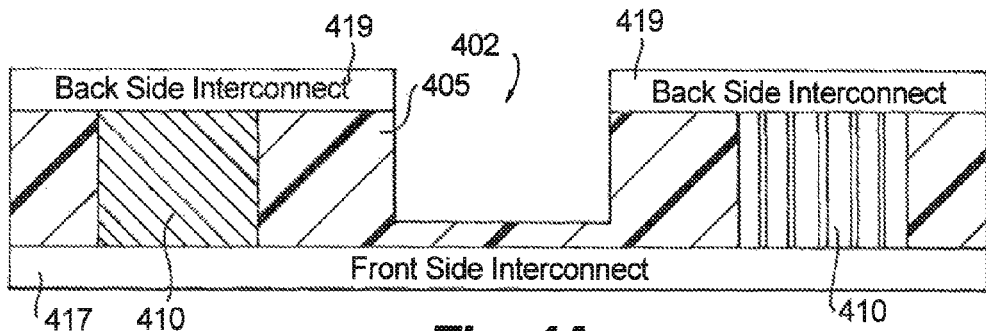
FIGS. 4A-4F illustrate a cross-sectional view of a reconstructed wafer, after the following wafer molding, front side interconnect formation, back side thinning, and back side interconnect formation.

FIG. 4A particularly shows the wafer 405 having die or dies 410, a front side interconnect 417, a back side interconnect 419, and a cavity 402 disposed in back side interconnect 419 and wafer 405. As described above with respect to cavity 202, cavity 402 can be made in a similar fashion.

Figure 4B:
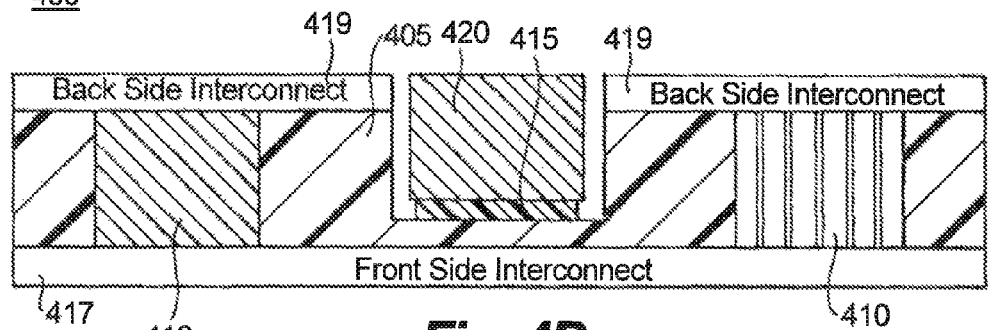

FIG. 4B shows device 420 disposed in cavity 402 and attached to wafer 405 via adhesive die attach 415. Die attach 415, similar to die attach 215, can include, for example, a bonding adhesive, organic adhesive, a solderable metal, etc.

Figure 4C:
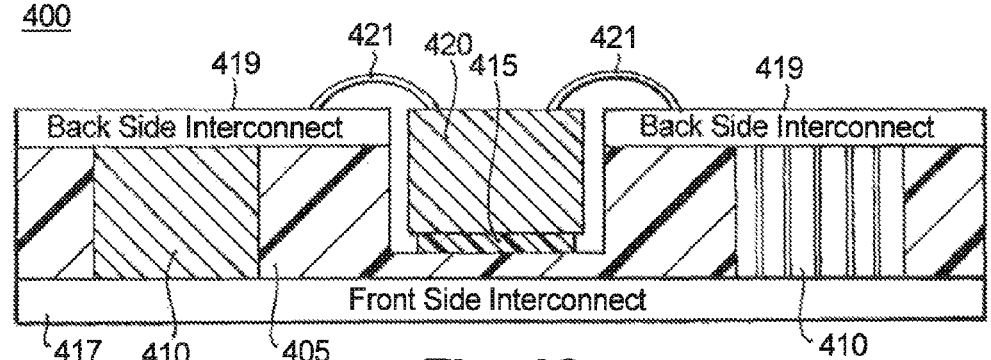

FIG. 4C shows electrical connections 421 between device 420 and back side interconnect 419. Particularly, the electrical connections include wire bonds (e.g., low profile wire bonding, insulated wire, etc.). In other embodiments, the electrical connections can include tab bonding, soldering conductors, screen printing, dispensed conductors, bond pad patterns to allow direct connection to next levels of circuitry, etc.

Figure 4D:
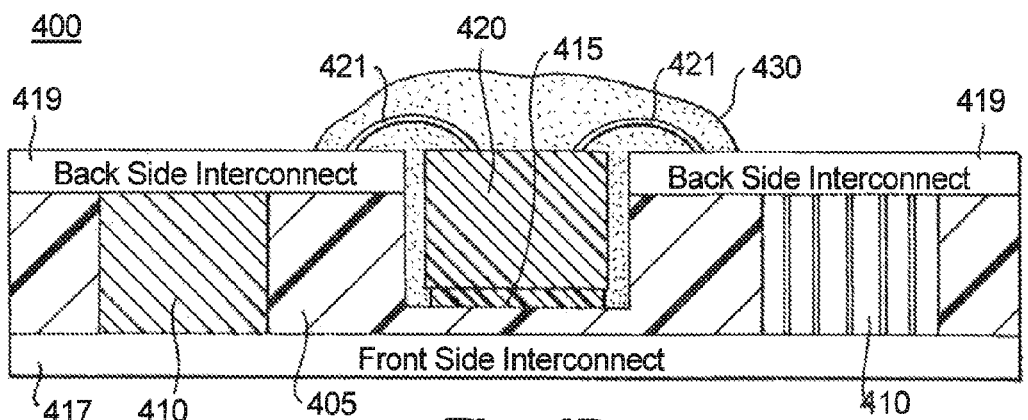

FIG. 4D shows device 420 being encapsulated by overmolding 430. Overmolding, or glob top encapsulation, protects electrical connections 421. Overmolding 430, similar to fill material 207 discussed above, can be formed in a variety of processes (e.g., pouring a liquid encapsulate between gaps of device 420, wafer 405 and back side interconnect 419, depositing and melting a thermoplastic solid, spin coating a dielectric (e.g., under a vacuum, multiple coats, etc.), and various other methods known by those skilled in the art). The overmolding 430 (and/or additional encapsulant) can be dispensed around a periphery of the device to protect wire bonds or other electrical connections while leaving a portion of the device exposed. This would be advantageous for devices that senses some aspect of the environment (e.g., photo diodes, imaging devices, microphones, humidity sensors, pressure sensors, etc.). This would also be advantageous for devices such as laser diodes or sound generators.

Figure 4E:
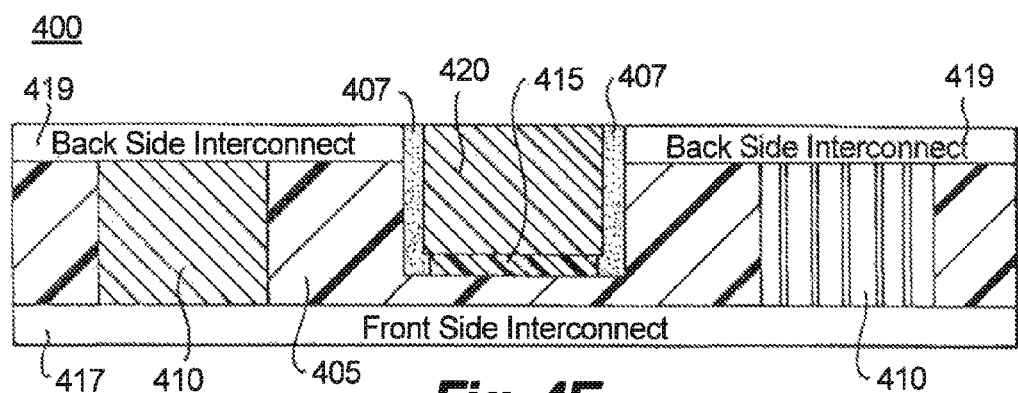
Figure 4F:
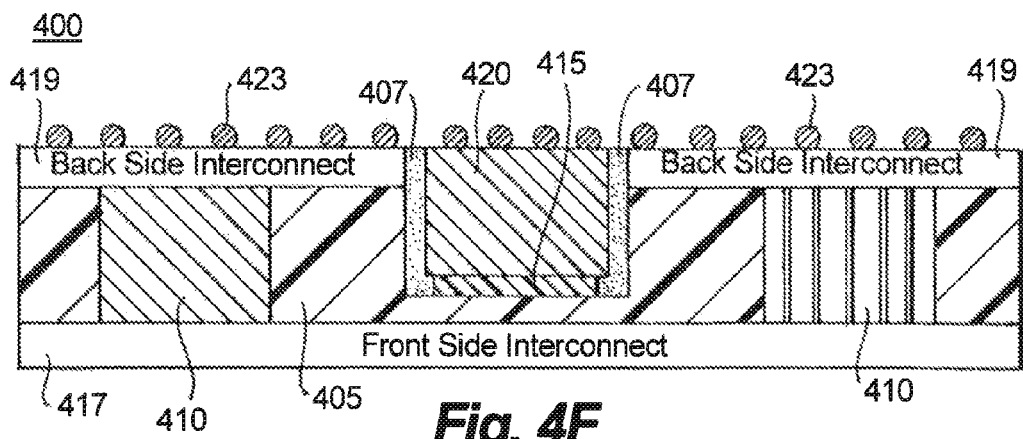

FIG. 4E is an alternative embodiment to FIGS. 4C-4D. That is, the process described by a progression following FIG. 4B (e.g., into FIGS. 4C-4D) can alternatively follow to FIGS. 4E-4F. Particularly from FIG. 4B (showing device 420 disposed in cavity 402), the empty space (e.g., cavity 402) can be filled with fill material similar to fill material 207 (e.g., described with reference to FIG. 2C). Such fill material 407 can include organic material such as epoxy filled with silica particles, which accommodate solder bumps, shown in FIG. 4E. Particularly, FIG. 4E shows solder bumps 423 connected to the backside interconnect 419 as well as the face of device 420. In this fashion, device 420 can allow for BGA style attaching to a subsequent or next level of interconnect.

Devices suitable for depositing in cavity 402 shown in FIGS. 4A-4D can include devices that are vulnerable to damage from spin-coating, process temperatures (~200 deg. C. for >5 hours), and exposure to solvents not withstand spin coating or thermal processing. Examples of such devices include, imaging devices with polymeric color filters, non-volatile memory devices, magnetic devices, devices with exposed mechanical elements, MEMS devices with fragile elements, devices with organic coatings (humidity sensors, pH sensors, etc.), etc.

The techniques described herein shield or mitigate stress for stress sensitive components during manufacture of reconstructed wafers. These techniques provide for stress mitigation at various steps of reconstructed wafer manufacture, including but not limited to: pre-encapsulation (stress buffer coating); post encapsulation (die insertion); post thinning (die insertion); and post back side interconnect formation.

It should be noted that certain steps and or figures are discussed as independent embodiments, such embodiments are shown for illustration and not limitation. Certain other steps of the various embodiments as discussed herein, may be combined, included or excluded as desired, and any suitable arrangement of the steps may be utilized without departing from the scope of the embodiments herein.

The foregoing description has been directed to specific embodiments. It will be apparent, however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method for constructing an electronic module, the method comprising the steps of:
    orienting at least one primary die having a top side, a bottom side and one or more die side walls on a substrate with the top side of the die proximate the substrate;
    forming a reconstructed wafer by encapsulating the primary die within a mold compound;
    removing the substrate to expose the top side of the primary die and a top side of the reconstructed wafer, the top side of the primary die and the top side of the reconstructed wafer being substantially co-planar;
    forming a cavity in the reconstructed wafer, the cavity having a bottom and defining one or more cavity side walls in the reconstructed wafer extending from the bottom of the cavity and terminating at the top side of the reconstructed wafer; and
    disposing a secondary die having a front side, a bottom side and one or more side walls in the cavity such that the bottom side of the secondary die is proximate to the bottom of the cavity.

2. The method of claim 1, further comprising:
    attaching the bottom side of the secondary die to the bottom of the cavity using stress buffer material.

3. The method of claim 1, wherein disposing the secondary die in the cavity further comprises disposing the secondary die in the cavity so as to leave space between the one or more side walls of the secondary die and the one or more cavity side walls defined by the cavity in the reconstructed wafer, the method further comprising:
    filling the space with fill material such that the fill material terminates at the substantially co-planar top side of the primary die and the top side of the reconstructed wafer.

4. The method of claim 3, wherein the fill material is a stress buffer material.

5. The method of claim 3, wherein the fill material is epoxy based material.

6. The method of claim 1, further comprising:
    disposing a dielectric film on the top side of the reconstructed wafer and at least one of the top side of the primary die and the top side of the secondary die.

7. The method of claim 1, further comprising:
    disposing one or more metal layers on the top side of the primary die and the top side of the secondary die to form a front interconnect layer.

\* \* \* \* \*